(12) United States Patent
Lee

(10) Patent No.: US 11,551,747 B2
(45) Date of Patent: Jan. 10, 2023

(54) COMPUTATION APPARATUS AND METHOD USING THE SAME

(71) Applicant: Taiwan Semiconductor Manufacturing Company, Ltd., Hsinchu (TW)

(72) Inventor: Cheng-Hung Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/213,182

(22) Filed: Mar. 25, 2021

(65) Prior Publication Data

US 2022/0310157 A1 Sep. 29, 2022

(51) Int. Cl.
*G11C 11/419* (2006.01)
*G06F 7/544* (2006.01)

(52) U.S. Cl.
CPC ............ *G11C 11/419* (2013.01); *G06F 7/544* (2013.01)

(58) Field of Classification Search
CPC .............................. G11C 11/419; G06F 7/544
USPC ......................................................... 365/154
See application file for complete search history.

(56) References Cited

U.S. PATENT DOCUMENTS

| | | | | |
|---|---|---|---|---|
| 10,388,364 B2* | 8/2019 | Ishizu | ................. | G11C 11/4099 |
| 10,847,212 B1* | 11/2020 | Haig | ..................... | G11C 11/419 |
| 10,964,362 B2* | 3/2021 | Jiang | ..................... | G06N 3/084 |
| 11,176,991 B1* | 11/2021 | Shaik | ..................... | G06F 7/5443 |
| 2009/0141537 A1* | 6/2009 | Arsovski | ............... | G11C 7/1006 |
| | | | | 365/189.15 |
| 2011/0267914 A1* | 11/2011 | Ishikura | ................. | G11C 29/70 |
| | | | | 365/208 |
| 2015/0029782 A1* | 1/2015 | Jung | ..................... | G11C 11/419 |
| | | | | 365/154 |
| 2015/0248927 A1* | 9/2015 | Fujiwara | ............... | G11C 11/419 |
| | | | | 365/72 |
| 2016/0027500 A1* | 1/2016 | Chuang | .................... | G11C 8/16 |
| | | | | 365/154 |
| 2016/0064068 A1* | 3/2016 | Mojumder | ............ | G11C 11/405 |
| | | | | 365/156 |
| 2020/0258890 A1* | 8/2020 | Augustine | ............... | H01L 27/11 |
| 2021/0192324 A1* | 6/2021 | Srivastava | ............. | G06N 3/063 |
| 2021/0240442 A1* | 8/2021 | Srivastava | .............. | G11C 8/16 |
| 2022/0012580 A1* | 1/2022 | Srivastava | .............. | G11C 11/54 |
| 2022/0044714 A1* | 2/2022 | Chang | ..................... | G11C 8/16 |

* cited by examiner

*Primary Examiner* — Sung Il Cho
(74) *Attorney, Agent, or Firm* — JCIPRNET

(57) ABSTRACT

A computation apparatus includes a plurality of memory cells and a plurality of sense amplifiers, in which each of the memory cells includes a memory circuit and a calculation circuit. The memory circuits of the memory cells are configured to receive input values from a plurality of word lines, generate a computation result based on the input values and output the computation result to a bit line. The calculation circuits of the memory cells are configured to receive calculation input values from a plurality of calculation word lines, generate calculation output values based on the calculation input values, and output the calculation output values to a plurality of calculation bit lines. The sense amplifiers are configured to sense the calculation output values from the calculation bit lines to generate sensed values, wherein a value of the computation result is determined based on the sensed values and the calculation output values.

20 Claims, 5 Drawing Sheets

COMPUTATION APPARATUS AND METHOD USING THE SAME

BACKGROUND

In CIM applications, a computation operation may be performed by memory cells of a memory device to obtain a computation result. For example, inputs are provided to word lines that are coupled to the memory cells, and the outputs from bit lines that are coupled to the memory cells are sensed. In a sensing scheme, an analog-to-digital converter (ADC) is coupled to the bit lines to receive the outputs and to convert the outputs to generate a computation result of the computation operation. However, a circuit structure of the ADC is complicated, and a circuit area and a power consumption of the ADC are relatively large. As such, a creative design that may eliminate the necessity of the ADC in the reading scheme is highly desirable.

BRIEF DESCRIPTION OF THE DRAWINGS

Aspects of the present disclosure are best understood from the following detailed description when read with the accompanying, figures. It is noted that, in accordance with the standard practice in the industry, various features are not drawn to scale. In fact, the dimensions of the various features may be arbitrarily increased or reduced for clarity of discussion.

DESCRIPTION OF EMBODIMENTS

Figure 1:
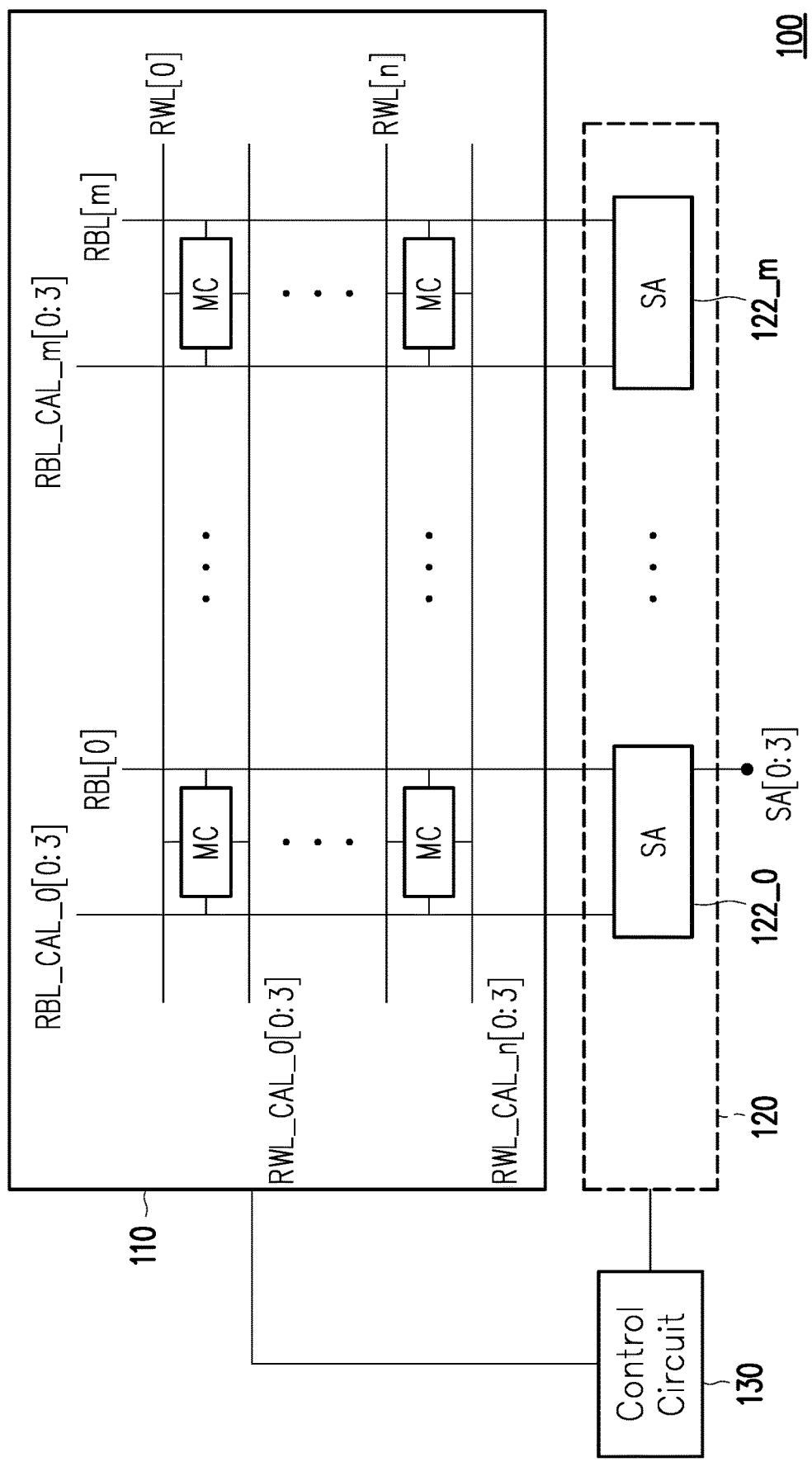
FIG. 1 is a schematic diagram illustrating a computation apparatus in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram illustrating a computation apparatus in accordance with some embodiments. Referring to FIG. 1, a computation apparatus 100 in accordance with some embodiments 100 may include a memory array 110 and a sense amplifier module 120. The memory array 110 may include a plurality of memory cells MC that are respectively coupled to a plurality of bit lines RBL[0] through RBL[m] and a plurality of word lines RWL[0] through RWL[n], in which m and n are positive integers. Each of the bit lines RBL[0] through RBL[m] may be coupled to a memory column that includes a plurality of memory cells MC of the memory array 110. In some embodiments, a group of memory cells MC may form a computation unit that is configured to perform a computation operation to generate a computation result. An example of the computation operation that is performed by the computation unit is a multiply-and-accumulate (MAC) operation. In some embodiments, input values are supplied the word lines that are coupled to the memory cells of the computation unit, and the computation result is obtained from the bit lines that are coupled to the memory cells of the computation unit.

In some embodiments, the memory cells of the computation unit are located in a specific memory column that corresponds to specific bit line, and the computation result is obtained from the specific bit line. The computation result may be obtained based on the input values that are inputted to the word lines and data values stored in the memory cells. The memory cells MC may store a plurality of weight values that are used for the computation operation. When the input values are provided to the word lines coupled to the memory cells MC, the output value from the specific bit line is equivalent to the computation results of the computation operation. For example, to perform the MAC operation using the group of memory cells that store a group of weight values (e.g., W0 through Wk), the input values (e.g., voltages V0 through Vk) are applied to the group of word lines that are coupled to the group of memory cells. When the input values are applied to the group of the memory cells, a value of $\Sigma_{i=0}^{k}(V_i \times W_i)$ is outputted to the bit line that is coupled to the group of memory cells, in which i and k are integers. The value of $\Sigma_{i=0}^{k}(V_i \times W_i)$ is equivalent to the computation result of the MAC operation.

In some embodiments, the bit lines RBL[0] through RBL[m] and the word lines RWL[0] through RWL[n] are used for a read operation on the memory cells MC. The memory array 110 may further include a plurality of write bit lines (not shown) and a plurality of write word lines (not shown) that are used for a write operation or a program operation to the memory cells MC. In some embodiments, the memory cells MC are configured to store the weight values for a computation operation, and the write operation may be performed on the memory cells MC to update the weight values.

In some embodiments, the memory array 110 further includes a plurality of calculation word lines RWL_CAL_0[0:3] through RWL_CAL_n[0:3] and a plurality of calculation bit lines RBL_CAL_0[0:3] through RBL_CAL_m[0:3]. In some embodiments, each of the calculation word lines RWL_CAL_0[0:3] through RWL_CAL_n[0:3] may include a specific number of sub calculation word lines (e.g., three sub calculation word lines) and each of the calculation bit lines RBL_CAL_0[0:3] through RBL_CAL_m[0:3] may include the specific number of sub calculation bit lines (e.g., three sub calculation bit lines). It is noted that the number of sub calculation word lines and sub calculation bit lines are not limited to any specific number.

The calculation word lines RWL_CAL_0[0:3] through RWL_CAL_n[0:3] are coupled to memory rows of the memory array 110; and the calculation bit lines RBL_CAL_0[0:3] through RBL_CAL_m[0:3] are coupled to memory columns of the memory array 110. In some embodiments, the calculation bit lines RBL_CAL_0[0:3] through RBL_CAL_m[0:3] and calculation word lines RWL_CAL_0[0:3] through RWL_CAL_n[0:3] are used to find the computation result on the bit lines RBL[0] through RBL[m] of the memory array 110. For example, the memory cells MC may receive calculation input values from the calculation word lines RWL_CAL_0[0:3] through RWL_CAL_n[0:3], and generate calculation output values based on the received calculation input values. The calculation output values are outputted to the calculation bit lines RBL_CAL_0[0:3] through RBL_CAL_m[0:3] of the memory array 110. The calculation output values from the calculation bit lines RBL_CAL_0[0:3] through RBL_CAL_m[0:3] are used to find the computation result. In some embodiments, the calculation output values and the computation result are inputted to a binary search for quickly finding out the value of the computation result. The binary search may keep adjusting the input values that are inputted to the calculation word lines until the value of the computation result is found.

In some embodiments, the sense amplifier module 120 may include a plurality of column sense amplifiers 122_0 through 122_m, in which a quantity of the column sense amplifiers 122_0 through 122_m is equivalent to a quantity of the memory columns in the memory array 110. In some embodiments, the quantity of the column sense amplifiers 122_0 through 122_m is equal to the quantity of the memory columns in the memory array 110. Each of the column sense amplifiers 122_0 through 122_m may be coupled to a corresponding bit line among the bit lines RBL[0] through RBL[m] and corresponding calculation bit lines among the calculation bit lines RBL_CAL_0[0:3] through RBL_CAL_m[0:3]. Each of the column sense amplifiers 122_0 through 122_m is configured to sense the calculation output values from the corresponding calculation bit lines, and compare the sensed calculation output values form the corresponding calculation bit lines to the computation result from the corresponding bit line to generate sensed values. For example, the column sense amplifier 122_0 is coupled to the bit line RBL[0] and the calculation bit lines RBL_CAL_0[0:3], and is configured to sense the calculation output values from the calculation bit lines RBL_CAL_0[0:3]. The column sense amplifier 122_0 may compare the calculation output values and the computation result on the bit line RBL[0] to generate the sensed values SA[0:3]. In some embodiments, the sensed values SA[0:3] and the calculation output values from the calculation bit lines RBL_CAL_0[0:3] are inputted to a binary search to determine the value of the computation result in a read operation. In this way, an analog-to-digital converter (ADC) is not needed for determining the value of the computation result in the read operation, and thus, the ADC may be eliminated from the computation apparatus 100. Since the ADC has complicated, large-in-size structure with high power consumption, the elimination of the ADC from the computation apparatus 100 may reduce the area penalty and the power consumption of the computation apparatus 100.

In some embodiments, the computation apparatus 100 may further include a control circuit 130 that is coupled to the sense amplifier module 120 and the memory array 110. The control circuit 130 may include control logic circuits that are configured to control the overall operation of the computation apparatus 100. For example, the control circuit 130 may control a sensing operation of the sense amplifier module 120 and control signals that are inputted to the word lines and the calculation word lines during the read operation. The structure and architecture of the control circuit 130 is not limited in the disclosure. In some embodiments, the computation apparatus 100 may include other circuits such as a row decoder, a column decoder, a voltage generator, or an input/output circuit (not shown) that are needed for a proper operation of the computation apparatus 100.

Figure 2A:
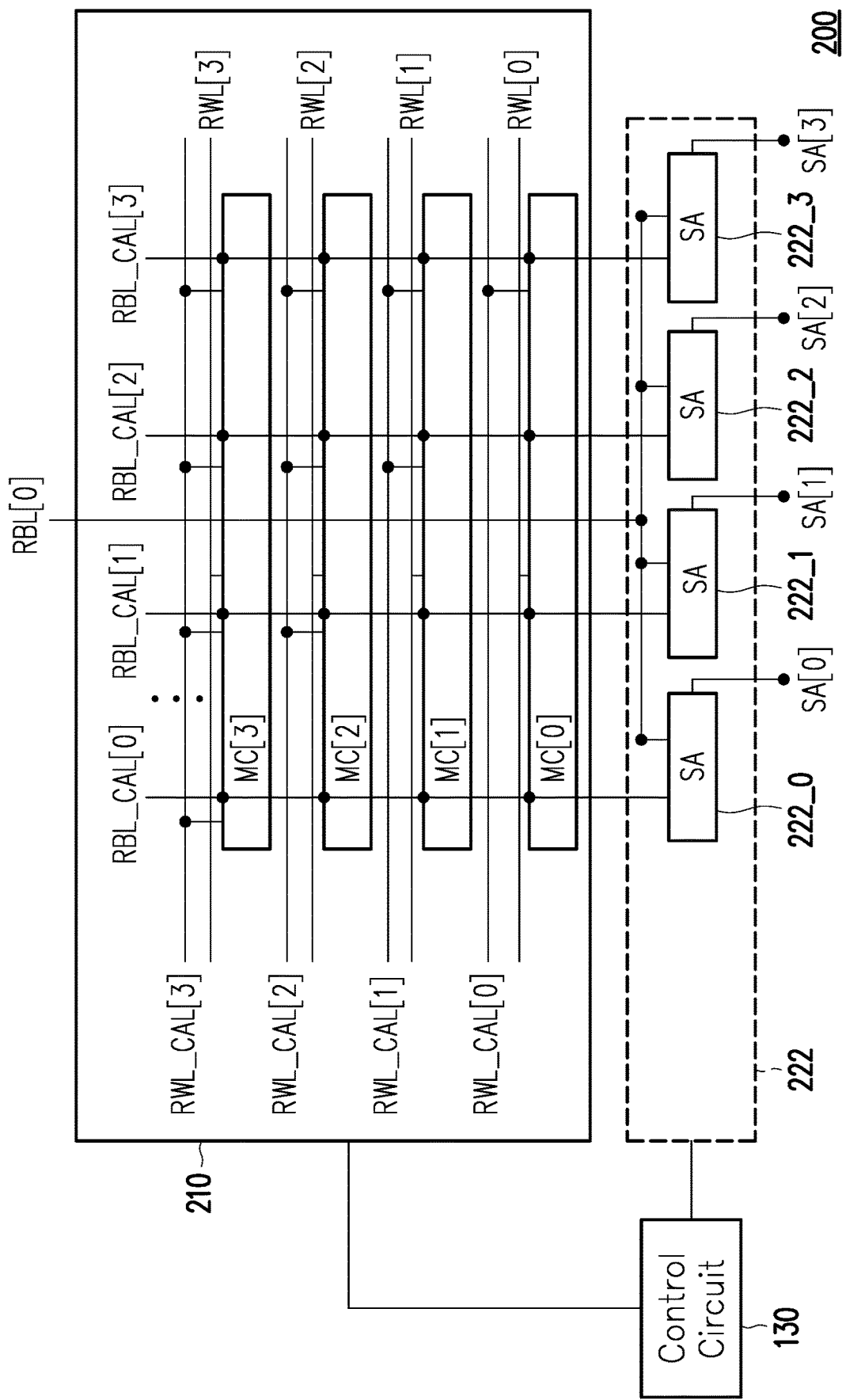
FIG. 2A is a schematic diagram illustrating a computation apparatus in accordance with some embodiments.
Figure 2B:
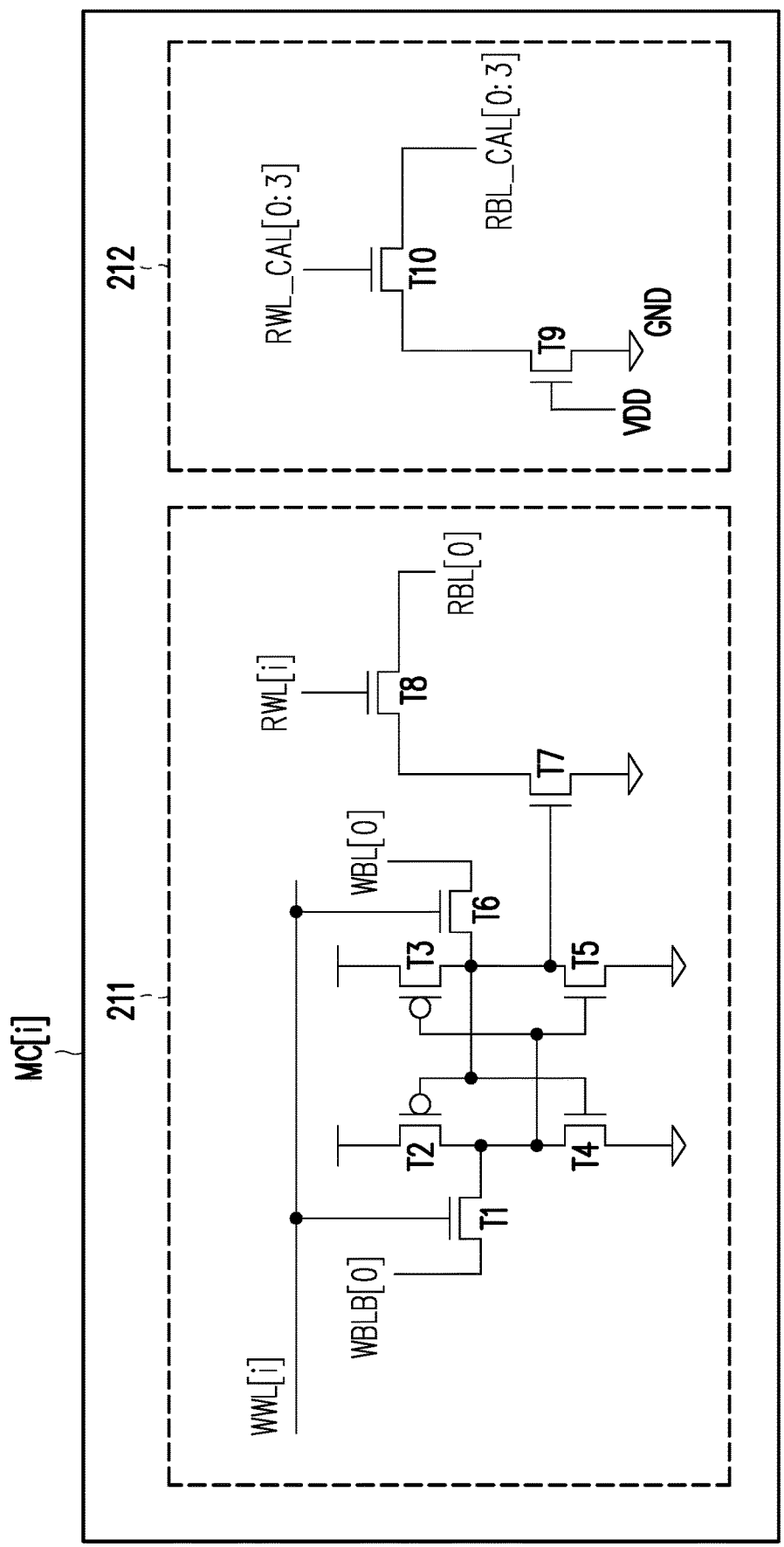
FIG. 2B is a schematic diagram illustrating a memory cell of the computation apparatus in FIG. 2A in accordance with some embodiments.

FIG. 2A is a schematic diagram illustrating a computation apparatus in accordance with some embodiments, and FIG. 2B is a schematic diagram illustrating a memory cell of the computation apparatus in FIG. 2A in accordance with some embodiments. Referring to FIG. 2A, a computation apparatus 200 that includes a memory array 210, a column sense amplifier 222, and a control circuit 130 in accordance with some embodiments is illustrated. The control circuit 130 of the computation apparatus 200 are same as the control circuit 130 of the computation apparatus 100 in FIG. 1; and the column sense amplifier 222 may be any one of the column sense amplifiers 122_0 through 122_m of the computation apparatus 100 in FIG. 1. In some embodiments, the memory array 210 includes a computation unit that is formed by the memory cells MC[0] through MC[3]. The memory cells MC[0] through MC[3] are coupled to the bit lines RBL[0], a plurality of word lines RWL[0] through RWL[3], a plurality of calculation word lines RWL_CAL[0] through RWL_CAL[3], and a plurality of calculation bit lines RBL_CAL[0] through RBL_CAL[3]. In some embodiments, the computation unit of the memory array 210 is configured to perform a computation operation (e.g., MAC operation) based on the values stored in the memory cells MC[0] through MC[3] and the input values applied to the word lines RWL_CAL[0] through RWL_CAL[3]. For example, if the memory cells MC[0] through MC[3] store weight values of W[0] through W[3] (not shown), respectively and voltage values of V[0] through V[3] are applied to the word lines RWL[0] through RWL[0], the computation result of the MAC operation is the value of $\Sigma(V_i \times W_i)$, where i is in range from 0 to 3 in this example. The computation result of the computation operation is outputted to the bit line RBL[0] of the memory array 210.

In some embodiments, the column sense amplifier 222 includes a plurality of sense amplifiers 222_0 through 222_3, in which each of the sense amplifiers 222_0 through 222_3 is coupled to the bit line RBL[0] and a corresponding one of the calculation bit lines RWL_CAL[0] through RWL_CAL[3]. The sense amplifiers 222_0 through 222_3 are configured to output a sensed values SA[0] through SA[3] based on a comparison between the computation result from the bit line RBL[0] and the calculation output values from the calculation bit lines RWL_CAL[0] through RWL_CAL[3]. In some embodiments, the sensed values SA[0] through SA[3] are binary bits that indicate a comparison result between the calculation output values and the computation result. For example, the sense amplifier 222_0 is coupled to the bit line RBL[0] and the calculation bit line RWL_CAL[0], and is configured to generate the sensed value SA[0] based on the comparison of the computation result from the bit line RBL[0] and the calculation output value from the calculation bit line RWL_CAL[0]. The sensed value SA[0] may have a logic state "1" when the computation result from the bit line RBL[0] is greater than the calculation output value from the calculation bit line RWL_CAL[0], and the sensed value SA[0] may have a logic state "0" when the computation result from the bit line RBL[0] is smaller than the calculation output value from the calculation bit line RWL_CAL[0].

FIG. 2B illustrates a schematic diagram of a memory cell MC[i] in accordance with some embodiments. The memory cell MC[i] in FIG. 2B may be any one of the memory cells MC[0] through MC[3] of computing apparatus 200 shown in FIG. 2A. In some embodiments, the memory cell MC[i] includes a memory circuit 211 and a calculation circuit 212, in which the memory circuit 211 is configured to store data value of the memory cell MC[i] that is used to generate a computation result, and the calculation circuit 212 is configured to determine a value of the computation result. The memory circuit 211 may include a memory element that includes transistors T2 through T5, a write port that includes transistors T1 and T6, and a read port that includes transistor T7 and T8. The transistors T2 through T5 of the memory element are coupled to form two cross-coupled inverters that are configured to store the data value of the memory cell MC[i]. The gates of the transistors T1 and T6 of the write port is coupled to a write word line WWL[i], in which the data value is written to the memory element based on the signal from the write word line WWL[i] in a write operation. The transistors T1 and T6 of the write port are further coupled to write bit lines WBL[0] and WBLB[0] in the write operation. The transistor T7 is coupled to the memory element, and the transistor T8 of the read port is coupled between the transistor T7 and the bit line RBL[0]. The gate of the transistor T8 is coupled to a word line RWL[i] which is one of the word lines of the memory array 210. The word line RWL[i] is configured to output the data to the bit line RBL[0] in a read operation.

In some embodiments, the calculation circuit 212 includes transistors T9 and T10 that are coupled to each other in series. The transistor T9 has a first terminal, a second terminal and a control terminal, in which the first terminal is coupled to a reference node GND, the second terminal is coupled to the transistor T10, and the control terminal is coupled to receive the reference voltage VDD. The reference node GND is supplied with a ground reference voltage (e.g., zero volt), and the reference voltage VDD is configured to control the operation of the transistor T9.

In some embodiments, the transistor T10 includes a first terminal, a second terminal and a control terminal, wherein the first terminal is coupled to the transistor T9, the second terminal is coupled to the calculation bit lines RBL_CAL[0:3] and the control terminal is coupled to the calculation word lines RWL_CAL[0:3]. The transistor T10 is controlled by the calculation input values from the calculation word lines RWL_CAL[0:3]. In some embodiments, a quantity of the transistors T9 and T10 in the calculation circuit 212 is equal to a quantity of the calculation word lines RWL_CAL[0:3] that are coupled to the memory cell M[j]. For example, if there are four calculation word lines RWL_CAL[0:3] coupled to the memory cell M[j], there are four transistors T9 and four transistors T10 that are coupled to the four calculation word lines RWL_CAL[0:3], respectively.

In some embodiments, a size and a structure of the transistor T10 of the calculation circuit 212 are identical to a size and a structure of the transistor T8 of the memory circuit 211. The size of a transistor may include at least one of a width of the transistor and a length of the transistor. In addition, the calculation circuit 212 and the memory circuit 211 may be designed in such a way that the transistor T10 of the calculation circuit 212 and the transistor T8 of the memory circuit 211 have the same metal loading. As such, a slew rate and a pulse width of the calculation word line signals from the calculation word lines RWL_CAL[0:3] track well with the word line signals from the word lines RWL[0:3]. In addition, as the pulse width of the word line signals and the calculation word line signals are related to a discharge of the bit lines, non-linearity effect from the word line signals and the bit line discharge voltage is reduced.

In some embodiments, the transistor T9 of the calculation circuit 212 of a first memory cell is shared to the calculation circuit 212 of a second memory cell. In some embodiments, the transistor T9 of the calculation circuit 212 may be shared to all memory cells of the memory array 210. In this way, the area penalty and the power consumption of the computation apparatus 200 is further reduced. In some embodiments, the calculation circuit 212 is configured to generate calculation output values based on the calculation input values from the calculation word lines RWL_CAL[0:3]. The calculation circuit 212 may provide the calculation output values to the calculation bit lines RBL_CAL[0:3] which are sensed by the sense amplifiers (e.g., sense amplifiers 222_0 through 222_3) for determining the value of the computation result.

Referring to FIG. 2A and FIG. 2B, the calculation input values that are inputted to the calculation word lines RWL_CAL[0:3] are adjusted until the value of the computation result is determined. In some embodiments, the control circuit 130 receives the sensed values SA[0] through SA[3] from the sense amplifiers 222_0 through 222_3 and the calculation output values form the calculation bit lines RBL_CAL[0:3], and is configured to adjust the calculation input values until the value of the computation result is determined. In an example, a binary search may be implemented in the control circuit 130 to adjust the calculation input values and to determine value of the computation result. In an example, it is assumed that the value of computation result from the bit line RBL[0] is an integer having a value of 29, and there are four sense amplifiers 222_0 through 222_3 included in the column sense amplifier 222. In a first operation cycle, the calculation input values form the calculation word lines RWL_CAL[0:3] may be set to [8, 8, 8, 8]. Accordingly, the calculation output values from the calculation bit lines RBL_CAL[0:3] are [8, 16, 24, 32] and the sensed values SA[0:3] are [1, 1, 1, 0]. The sensed values and the calculation output values indicates that the computation result must be in a range from 24 to 32.

In a second operation cycle, the calculation input values form the calculation word lines RWL_CAL[0:3] may be set to [12, 12, 4, 4]. Accordingly, the calculation output values from the calculation bit lines RBL_CAL[0:3] are [12, 24, 28, 32] and the sensed values SA[0:3] are [1, 1, 1, 0]. The sensed values and the calculation output values indicates that the computation result must be in a range from 28 to 32. In an alternative embodiments, the calculation input values form the calculation word lines RWL_CAL[0:3] may be set to [24, 3, 3, 3] in the second operation cycle or any other suitable set of calculation input values.

In a third operation cycle, the calculation input values form the calculation word lines RWL_CAL[0:3] may be set to [14, 14, 2, 2]. Accordingly, the calculation output values from the calculation bit lines RBL_CAL[0:3] are [14, 28, 30, 32] and the sensed values SA[0:3] are [1, 1, 0, 0]. The sensed values and the calculation output values indicates that the computation result must be in a range from 28 to 30. Since the computation result is the integer in the above assumption, the value of the computation result must be 29. In this way, the value of the computation result may be found in three operation cycles. In an alternative embodiments, the calculation input values form the calculation word lines RWL_CAL[0:3] may be set to [28, 1, 1, 1] in the third operation cycle or any other suitable set of calculation input values.

It is noted that the quantity of operation cycles for determining the value of the computation result depends on the quantity of the sense amplifiers included in the column amplifier 222. As the quantity of the sense amplifiers increases, the quantity of operation cycles needed for determining the value of the of the computation result reduces; and as the quantity of the sense amplifiers decreases, the quantity of operation cycles need for determining the value of the of the computation result increases. It is noted that binary search is illustrated as an example for determining the computation result from the bit lines RBL[0], but the disclosure is not limited thereto. Any other way that uses hardware, software or firmware technique for finding the value of the computation result based on the sensed values and the calculation output values falls within the scope of the disclosure.

Figure 3:
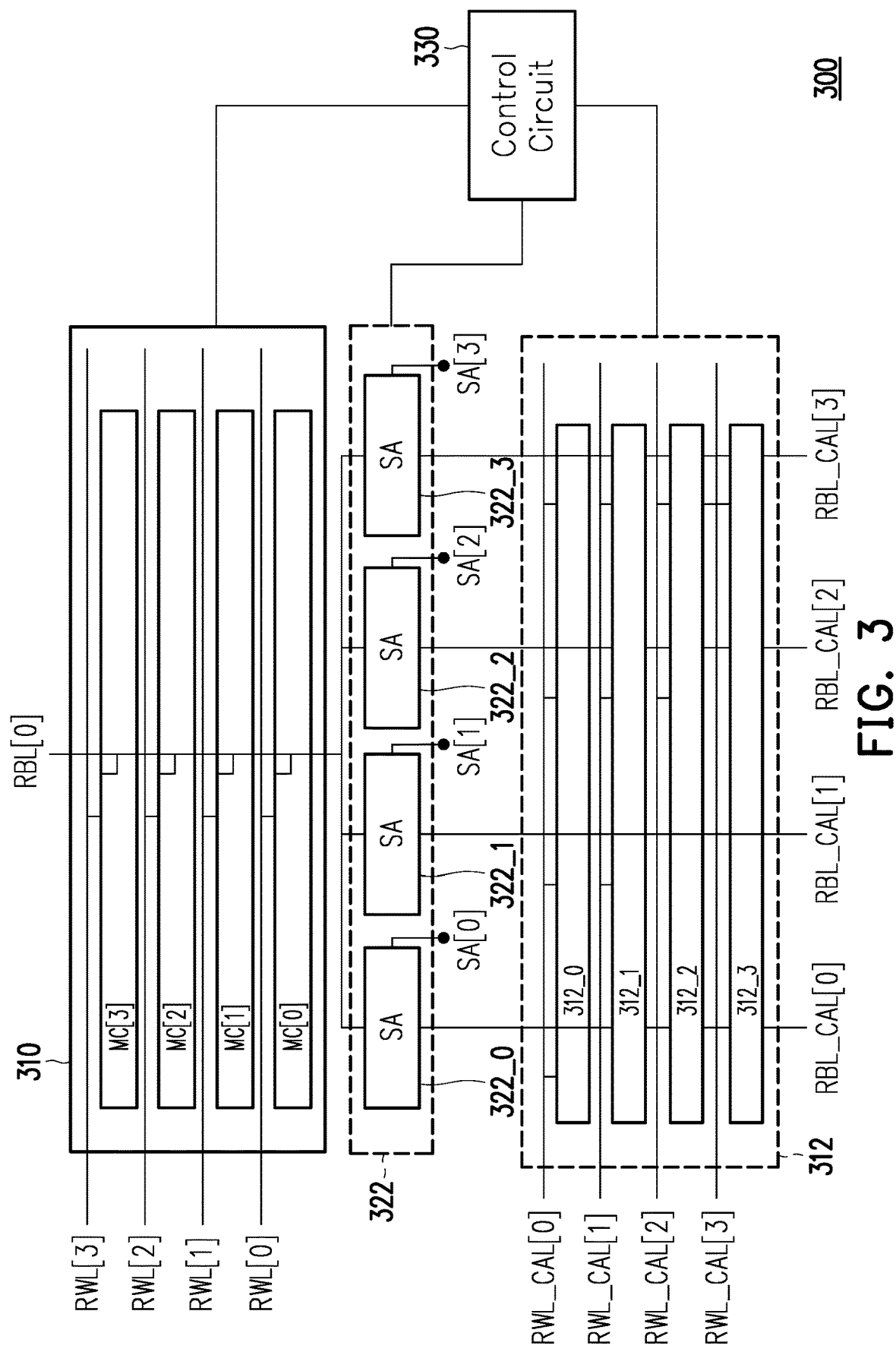
FIG. 3 is a schematic diagram illustrating a computation apparatus in accordance with some embodiments.

FIG. 3 is a schematic diagram illustrating a computation apparatus in accordance with some embodiments. Referring to FIG. 3, a schematic diagram of a computation apparatus 300 in accordance with some embodiments may include a memory array 310, a column sense amplifier 322, a calculation module 312 and a control circuit 330. The control circuit 330 and the column sense amplifier 322 of the computation apparatus 300 is same as the control circuit 130 and the column sense amplifier 222 of the computation apparatus 200 in FIG. 2A, thus the detail description is omitted hereafter. The memory array 310 may include a computation unit that is formed by memory cells MC[0] through MC[3]. The memory cells MC[0] through MC[3] are coupled to the bit line RBL[0] and the word lines RWL[0] through RWL[3]. In some embodiments, the computation unit of the memory array 310 is configured to perform a computation operation (e.g., MAC operation) based on the values stored in the memory cells MC[0] through MC[3] and the input values applied to the word lines RWL_CAL[0] through RWL_CAL[3] to output a computation result to the bit line RBL[0].

In some embodiments, the calculation module 312 includes a plurality of calculation circuits 312_0 through 312_3 which are coupled to a plurality of calculation bit lines RBL_CAL[0] through RBL_CAL[3] and a plurality of calculation word lines RWL_CAL[0] through RWL_CAL[3]. The calculation circuits 312_0 through 312_3 are configured to determine the value of the computation result from the bit line RBL[0] based on the calculation input values that are inputted to the calculation word lines RWL_CAL[0] through RWL_CAL[3]. In some embodiments, the calculation circuits 312_0 through 312_3 receive the calculation input values from calculation word lines RWL_CAL[0] through RWL_CAL[3], generate the calculation output values based on the calculation input values, and provide the calculation output values to the calculation bit lines RBL_CAL[0] through RBL_CAL[3]. The sense amplifiers 322_0 through 322_3 receive the computation result from the bit line RBL[0] and the calculation output values from the calculation bit lines RBL_CAL[0] through RBL_CAL[3], and is configured to output sensed values SA[0] through SA[3] based on the computation result and the calculation output values. In some embodiments, the sensed values SA[0] through SA[3] of the sense amplifiers 322_0 through 322_3 indicate comparison results between the computation result and the calculation output values.

In some embodiments, the calculation output values from the calculation bit lines RBL_CAL[0] through RBL_CAL[3] and the sensed values SA[0] through SA[3] are inputted to a search algorithm (e.g., binary search) for determining the value of the computation result. In an example, the search algorithm may adjust the calculation input values that are inputted to the calculation bit lines RWL_CAL[0] through RWL_CAL[3] until the value of the computation result is determined.

In some embodiments, the structure of each of the memory cells MC[0] through MC[3] of the computation apparatus 300 is same as the structure of the memory circuit 211 shown in FIG. 2B, thus the detail description about the structure of the memory cells MC[0] through MC[3] is omitted hereafter. In some embodiments, the structure of each of the calculation circuits 312_0 through 312_3 of the computation apparatus 300 is same as the structure of the calculation circuit 212 shown in FIG. 2B, thus the detail description about the structure of the calculation circuits 312_0 through 312_3 is omitted hereafter.

Referring to FIG. 2A and FIG. 3, a difference between the computation apparatus 200 in FIG. 2A and the computation apparatus 300 in FIG. 3 is that the memory circuit 312_0 through 312_3 are located outside the memory array 310. In this way, a thickness of the memory array 310 as shown in FIG. 3 is reduced in comparison to the thickness of the memory array 210 as shown in FIG. 2A. Referring to FIG. 2B and FIG. 3, in some embodiments, the transistor T9 is shared for all the calculation circuits (e.g., calculation circuits 312_0 through 312_3). In this way, the area penalty and the power consumption of the calculation circuit module 312 is further reduced.

Figure 4:
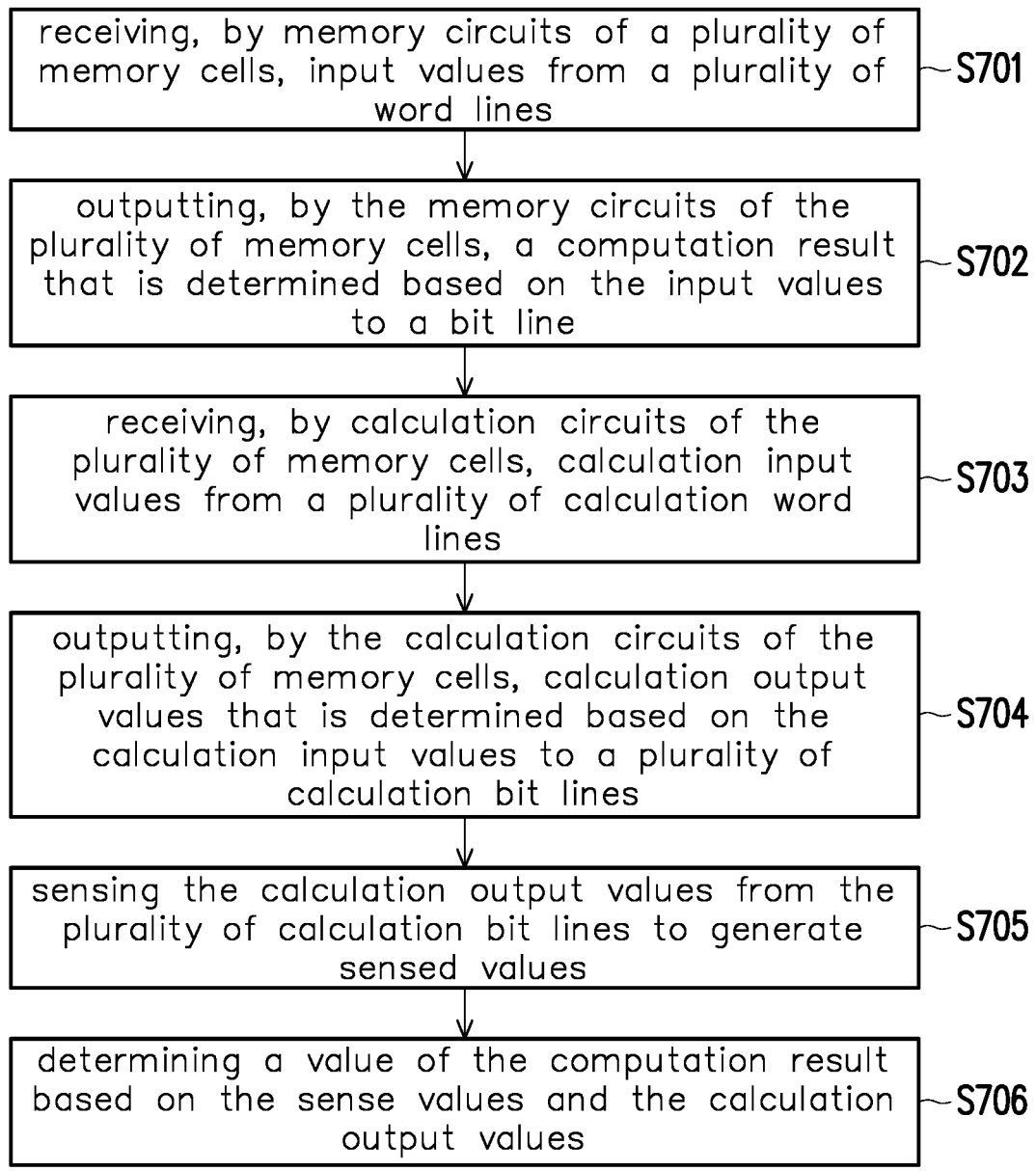
FIG. 4 is a flowchart diagram illustrating a method adapted to a computation apparatus in accordance with some embodiments.

FIG. 4 illustrate a flowchart diagram of a method that is adapted to a computation apparatus in accordance with some embodiments. In step S401, input values from a plurality of word lines is received by memory circuits of a plurality of memory cells of the computation apparatus. In step S402, a computation result that is determined based on the input values is outputted to a bit line of the computation apparatus. In some embodiments, the memory cells may store weight values, and the computation result is determined according to the weight values stored in the memory cells and the received input values. In step S403, calculation input values from a plurality of calculation word lines are received by calculation circuits of the plurality of memory cells. In some embodiments, the calculation circuits are located inside the memory cells. In some alternative embodiments, the calculation circuits are located outside the memory cells. In step S404, calculation output values that is determined based on the calculation input values are outputted to a plurality of calculation bit lines by the calculation circuits of the plurality of memory cells. In step S405, the calculation output values from the plurality of calculation bit lines are sensed to generate sensed values. In some embodiments, sense amplifiers are included in the computation apparatus for sensing calculation output values to generate the sensed values. In step S406, a value of the computation result is determined based on the sense values and the calculation output values.

In accordance with the above embodiments, a plurality of calculation word lines, a plurality of calculation bit lines, and a plurality of sense amplifiers are designed in a computation apparatus to determine a value of a computation result. In response to receiving calculation input values in the calculation word lines, calculation output values are generated and outputted to the calculation bit lines. The sense amplifiers may sense the calculation output values from the calculation bit lines to generate sensed values that are used to determine the value of the computation result. For example, the sensed values and the calculation output values are inputted to a search algorithm (e.g., binary search) to determine the value of the computation result. In this way, a role of ADCs in reading of the computation apparatus is eliminated. Since the ADCs have area penalty and are complicated with high power consumption, the embodiments of the disclosure may reduce the area penalty, complexity and power consumption of the computation apparatus.

In accordance with some embodiments, a computation apparatus includes a plurality of memory cells and a plurality of sense amplifiers. The plurality of memory cells are coupled to a plurality of word lines, a bit line, a plurality of calculation bit lines and a plurality of calculation word lines. Each of the plurality of memory cells includes a memory circuit that is coupled to one of the plurality of word lines and the bit line and a calculation circuit that is coupled to the plurality of calculation word lines and the plurality of calculation bit lines. The plurality of sense amplifiers, coupled to the bit line and the plurality of the calculation bit lines. The memory circuits of the plurality of memory cells are configured to receive input values from the plurality of word lines, generate a computation result based on the input values and output the computation result to the bit line. The calculation circuits of the plurality of memory cells are configured to receive calculation input values from the plurality of calculation word lines, generate calculation output values based on the calculation input values, and output the calculation output values to the plurality of calculation bit lines. The plurality of sense amplifiers are configured to sense the calculation output values from the plurality of calculation bit lines to generate sensed values, wherein a value of the computation result is determined based on the sensed values and the calculation output values.

In accordance with some embodiments, the computation apparatus includes a plurality of memory cells, a plurality of calculation circuits and a plurality of sense amplifiers. The plurality of memory cells are coupled to a plurality of word lines and a bit line, where the plurality of memory cells includes a plurality of memory circuits. The plurality of memory circuits are configured to receive input values from the plurality of word lines, generate a computation result based on the input values and output the computation result to a bit line. The plurality of calculation circuits are coupled to a plurality of calculation word lines and a plurality of calculation bit lines, and are, configured to receive calculation input values from the plurality of calculation word lines, generate calculation output values based on the calculation input values and outputting the calculation output values to the plurality of calculation bit lines. The plurality of sense amplifiers is coupled to the bit line and the plurality of the calculation bit lines, and are configured to sense the calculation output values from the plurality of calculation bit lines to generate sensed values. The computation result is determined according to the sensed values and the calculation output values.

In accordance with some embodiments, the method includes steps of receiving, by memory circuits of the plurality of memory cells, input values from a plurality of word lines; generating, by the memory circuits of the plurality of memory cells, a computation result based on the input values and outputting the computation result to a bit line; receiving, by calculation circuits of the plurality of memory cells, calculation input values from a plurality of calculation word lines; generating, by the calculation circuits of the plurality of memory cells, calculation output values based on the calculation input values and outputting the calculation output values to a plurality of calculation bit lines; sensing the calculation output values from the plurality of calculation bit lines to generate sensed values; and determining a value of the computation result based on the sense values and the calculation output values.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A computation apparatus, comprising:
a plurality of memory cells, coupled to a plurality of word lines, a bit line, a plurality of calculation bit lines and a plurality of calculation word lines, wherein each of the plurality of memory cells comprises:
   a memory circuit, coupled to one of the plurality of word lines and the bit line; and
   a calculation circuit, coupled to the plurality of calculation word lines and the plurality of calculation bit lines; and
a plurality of sense amplifiers, coupled to the bit line and the plurality of the calculation bit lines,
wherein the memory circuits of the plurality of memory cells are configured to receive input values from the plurality of word lines, generate a computation result based on the input values and output the computation result to the bit line, the calculation circuits of the plurality of memory cells are configured to receive calculation input values from the plurality of calculation word lines, generate calculation output values based on the calculation input values, and output the calculation output values to the plurality of calculation bit lines, and the plurality of sense amplifiers are configured to sense the calculation output values from the plurality of calculation bit lines and compare the sensed calculation output values to the computation result from the bit line to generate sensed values, wherein a value of the computation result is determined based on the sensed values and the calculation output values.

2. The computation apparatus of claim 1, wherein the calculation circuit of each one of the plurality of memory cells comprises:
a first transistor, having a control terminal configured to receive a predetermined voltage; and
a second transistor, having a first terminal, a second terminal and a control terminal, wherein the first terminal of the second transistor is coupled to the first transistor, the second terminal of the second transistor is coupled to the plurality of calculation bit lines and the control terminal of the second transistor is coupled to the plurality of calculation word lines.

3. The computation apparatus of claim 2, wherein each one of the memory cell comprises:
a memory element, comprising a first inverter and a second inverter that is cross-coupled to the first inverter, and configured to store a data value of the memory cell; and
a read port, coupled to the bit line, and configured to output the data value stored in the memory element to the bit line in a read operation, wherein the read port comprises:
a third transistor, coupled between the memory element and the bit lines, wherein a control terminal of the third transistor is coupled to the one of the plurality of word lines.

4. The computation apparatus of claim 3, wherein
a size of the third transistor of the memory circuit is same as a size of the second transistor of the memory circuit.

5. The computation apparatus of claim 2, wherein
the first transistor of the calculation circuit is shared to other calculation circuits among the plurality of calculation circuits.

6. The computation apparatus of claim 1, wherein
a quantity of the plurality of sense amplifiers is equal to a quantity of the calculation bit lines,
each of the plurality of sense amplifiers corresponds to one of the plurality of calculation bit lines, and
each of the plurality of sense amplifiers is coupled to the corresponding one of the plurality of calculation bit lines and the bit line.

7. The computation apparatus of claim 1, further comprising:
a control circuit, coupled to the plurality of sense amplifiers, and configured to:
determine whether the value of the computation result is found based on the sensed values and the calculation output values, and
when the value of the computation result is not found, adjust the calculation input values that are inputted to the calculation bit lines to generate adjusted sensed values and adjusted calculation output values until the value of the computation result is determined.

8. The computation apparatus of claim 1, wherein the plurality of calculation circuits are located outside the plurality of memory cells.

9. A computation apparatus, comprising:
a plurality of memory cells, coupled to a plurality of word lines and a bit line, and comprising a plurality of memory circuits that are configured to receive input values from the plurality of word lines, generate a computation result based on the input values and output the computation result to the bit line;
a plurality of calculation circuits, coupled to a plurality of calculation word lines and a plurality of calculation bit lines, and configured to receive calculation input values from the plurality of calculation word lines, generate calculation output values based on the calculation input values and outputting the calculation output values to the plurality of calculation bit lines; and
a plurality of sense amplifiers, coupled to the bit line and the plurality of the calculation bit lines, and configured to sense the calculation output values from the plurality of calculation bit lines and compare the sensed calculation output values to the computation result from the bit line to generate sensed values, wherein the computation result is determined according to the sensed values and the calculation output values.

10. The computation apparatus of claim 9, wherein the plurality of calculation circuits are located outside the plurality of memory cells.

11. The computation apparatus of claim 9, wherein each one of the plurality of calculation circuits comprises:
a first transistor, having a control terminal configured to receive a predetermined voltage; and
a second transistor, having a first terminal, a second terminal and a control terminal, wherein the first terminal of the second transistor is coupled to the first transistor, the second terminal of the second transistor is coupled to the plurality of calculation bit lines and the control terminal of the second transistor is coupled to the plurality of calculation word lines.

12. The computation apparatus of claim 11, wherein
the first transistor of the calculation circuit is shared to other calculation circuits among the plurality of calculation circuits.

13. The computation apparatus of claim 11, wherein each one of the plurality of memory circuits comprises:
a memory element, comprising a first inverter and a second inverter that is cross-coupled to the first inverter, and configured to store a data value of the memory cell; and
a read port, coupled to the bit line, and configured to output the data value stored in the memory element to the bit line in a read operation,
wherein the read port comprises:
a third transistor, coupled between the memory element and the bit lines, wherein a control terminal of the third transistor is coupled to the one of the plurality of word lines.

14. The computation apparatus of claim 13, wherein
a size of the third transistor of the memory circuit is same as a size of the second transistor of the memory circuit.

15. The computation apparatus of claim 9, wherein
a quantity of the plurality of sense amplifiers is equal to a quantity of the calculation bit lines,
each of the plurality of sense amplifiers corresponds to one of the plurality of calculation bit lines, and
each of the plurality of sense amplifiers is coupled to the corresponding one of the plurality of calculation bit lines and the bit line.

16. The computation apparatus of claim 15, further comprising:
a control circuit, coupled to the plurality of sense amplifiers, and configured to:
determine whether the value of the computation result is found based on the sensed values and the calculation output values, and
when the value of the computation result is not found, adjust the calculation input values that are inputted to the calculation bit lines to generate adjusted sensed values and adjusted calculation output values until the value of the computation result is determined.

17. A sensing method, adapted to a computation apparatus comprising a plurality of memory cells, the sensing method comprising:
receiving, by memory circuits of the plurality of memory cells, input values from a plurality of word lines;
generating, by the memory circuits of the plurality of memory cells, a computation result based on the input values and outputting the computation result to a bit line;
receiving, by calculation circuits of the plurality of memory cells, calculation input values from a plurality of calculation word lines;
generating, by the calculation circuits of the plurality of memory cells, calculation output values based on the calculation input values and outputting the calculation output values to a plurality of calculation bit lines;
sensing, by a plurality of sense amplifiers, the calculation output values from the plurality of calculation bit lines and the computation result from the bit line;
comparing each of the calculation output values to the computation result to generate a comparison result;

generating sensed values based on the comparison result; and determining a value of the computation result based on the sense values and the calculation output values.

18. The sensing method of claim 17, wherein determining the value of the computation result based on the sense values and the calculation output values comprises:

determining whether the value of the computation result is found based on the sensed values and the calculation output values; and when the value of the computation result is not found, adjusting the calculation input values that are inputted to the calculation bit lines to generate adjusted sensed values and adjusted calculation output values until the value of the computation result is determined.

19. The sensing method of claim 17, wherein the calculation circuit of each one of the plurality of memory cells comprises:

a first transistor, having a control terminal configured to receive a predetermined voltage; and a second transistor, having a first terminal, a second terminal and a control terminal, wherein the first terminal of the second transistor is coupled to the first transistor, the second terminal of the second transistor is coupled to the plurality of calculation bit lines and the control terminal of the second transistor is coupled to the plurality of calculation word lines.

20. The sensing method of claim 17, wherein a quantity of the plurality of sense amplifiers is equal to a quantity of the calculation bit lines, each of the plurality of sense amplifiers corresponds to one of the plurality of calculation bit lines, and each of the plurality of sense amplifiers is coupled to the corresponding one of the plurality of calculation bit lines and the bit line.

* * * * *